July 28, 1964 E. C. CORNISH 3,142,767

RESETTABLE TUNNEL DIODE CIRCUIT

Filed Jan. 24, 1961

INVENTOR.
Eldon C. Cornish
BY
Carl V. Olson
ATTORNEY

United States Patent Office 3,142,767

Patented July 28, 1964

3,142,767

RESETTABLE TUNNEL DIODE CIRCUIT

Eldon C. Cornish, Pennsauken, N.J., assignor to Radio Corporation of America, a corporation of Delaware Filed Jan. 24, 1961, Ser. No. 84,587

8 Claims. (Cl. 307—88.5)

This invention relates to two-condition switch circuits, and more particularly to tunnel diode circuits which may be switched between low voltage and high voltage states. The circuits may be bistable and arranged to assume one stable state when energized by a set pulse and to return to the original state when energized by a reset pulse. By way of example, two-condition switch circuits constitute one of the more important building blocks of high speed electronic computers.

Tunnel diodes are useful in electronic computers because of the very high speed at which they can be switched between a low voltage stable state and a high voltage stable state.

It is a general object of this invention to provide an improved two-condition tunnel diode circuit giving good performance and requiring relatively few circuit elements.

It is another object of this invention to provide a resettable tunnel diode circuit characterized in requiring relatively small amplitude input set and reset pulses.

It is a further object to provide a resettable bistable tunnel diode circuit wherein the set and reset input signal requirements are relatively unaffected by the load presented to the output terminal by a utilization device.

It is a still further object to provide a resettable bistable tunnel diode circuit which delivers output signal voltage levels that are substantially constant with time and are relatively unaffected by the load presented to the output terminal by a utilization device.

In one aspect, the invention includes a resistor, a tunnel diode and an inductor connected in series in the order named across the positive and negative terminals of a direct current bias power supply. A tunnel rectifier is connected across the tunnel diode and the inductor. Input means are provided to apply a set input pulse across the tunnel diode and the inductor, and to apply a reset pulse across the inductor. An output signal is available from across the tunnel diode and the inductor. The tunnel diode and the tunnel rectifier are selected and are direct current biased so that the circuit has a first stable operating condition with the tunnel rectifier in its high impedance state and the tunnel diode in a low voltage state, and so that there is a second stable operating condition with the tunnel rectifier in a low impedance state and the tunnel diode in a high voltage state. The value of the inductor is selected so that the circuit is switched to one stable operating condition by an input reset pulse applied across the tunnel diode and inductor, and is returned to the other stable operating condition by an input reset pulse applied across the inductor. The circuit is characterized in being relatively easy to set and reset, and the output voltages are substantially constant in the two operating conditions and are substantially unaffected by the amount of load provided by a utilization circuit connected across the tunnel diode and inductor.

These and other objects and aspects of the invention will be apparent to those skilled in the art from the following more detailed description taken in conjunction with the appended drawings, wherein.

Figures 1, 2, 3:
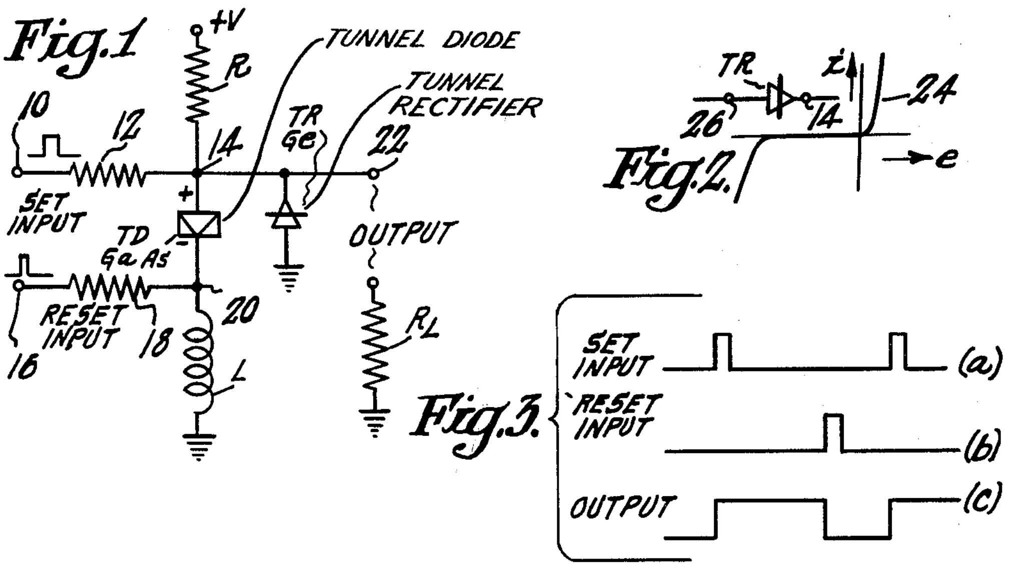
FIGURE 1 is a circuit diagram of a resettable bistable circuit constructed according to the teachings of this invention.
FIGURE 2 is a diagram illustrating the characteristics of the tunnel rectifier employed in the circuit of FIGURE 1.
FIGURE 3 is a chart of the input and output signal waveforms of the circuit of FIGURE 1.

The bistable circuit of FIGURE 1 includes a series circuit constituted by a bias resistor R, a tunnel diode TD and an inductor L. The series circuit is connected across the +V and ground terminals of a source of direct current bias potential. The considerations involved in the determination of the value of the inductor L are set forth at a later point in the description. A set input terminal 10 is connected through an input resistor 12 to the anode 14 of the tunnel diode TD. A reset input terminal 16 is connected through an input resistor 18 to the cathode 20 of the tunnel diode TD. A tunnel rectifier TR is connected across the tunnel diode TD and the inductor L. An output is derived from across the tunnel diode TD and the inductor L and is made available at an output terminal 22 for application to a utilization device or load represented in FIGURE 1 by the resistor $R_L$.

The tunnel diode TD in the circuit of FIGURE 1 is illustrated as a gallium arsenide tunnel diode, and the tunnel rectifier TR is illustrated as a germanium tunnel rectifier. These types of tunnel diode and tunnel rectifier are preferred in the circuit of FIGURE 1 because they have current-voltage characteristics in ranges related to each other in such a way that the circuit operates without the necessity for an additional different bias voltage source for the tunnel rectifier. The tunnel rectifier TR is represented by a symbol which is illustrated by the diagram of FIGURE 2 as a device having the current-voltage characteristic curve 24 wherein a relatively small positive potential *e* applied to the anode terminal 26 of the tunnel rectifier results in a current flow in the "forward" direction through the tunnel rectifier in the direction of the arrowhead of the symbol, and wherein a relatively larger negative voltage applied to the terminal 26 (or relatively larger positive voltage applied to the terminal 14) is required to produce a current flow in the reverse direction. The tunnel rectifier TR in the circuit of FIGURE 1 is connected to utilize the "back direction" portion of its characteristic extending to the left of the zero voltage axis in FIGURE 2.

In the circuit of FIGURE 1, the bias voltage +V, the bias resistor R, the tunnel diode TD and the tunnel rectifier TR are selected so that the circuit has two stable operating conditions. In a first stable operating condition, the tunnel diode TD has an operating point in the low voltage positive resistance region of its current-voltage characteristic curve near the current peak thereof, and the tunnel rectifier TR has an operating point on the high impedance or non-conducting portion of its current-voltage characteristic curve. The second stable operating condition is one wherein the tunnel diode TD has an operating point in the high voltage, positive resistance region of its characteristic curve, and the tunnel rectifier TR has an operating point in the low impedance or freely conducting region of its characteristic curve.

FIGURE 3 shows the output wave or signal *c* from the circuit of FIGURE 1 in response to set input signals *a* and reset input signals *b*. A set input pulse *a* applied to the set input 10 of the circuit of FIGURE 1 causes the circuit to switch from its low voltage condition to its high voltage condition. The circuit remains in its high voltage condition until a reset input pulse *b* is applied to the reset input terminal of the circuit. The reset input pulse causes the circuit to switch from its high voltage state back to its low voltage state. The output signal level *c* at the output terminal 22 of the circuit depends on whether the last received input pulse was a set input pulse or a reset input pulse. The circuit therefore operates as a bistable multivibrator having separate set and reset inputs.

It will be noted that the circuit of FIGURE 1 operates in response to set and reset input pulses which are both of positive polarity. The circuit of FIGURE 1 can provide an inverting function by merely transposing the input signals applied to the input terminals 10 and 16. If the set pulse is applied to the input terminal 16 and the reset pulse is applied to the input terminal 10, the output signal is inverted. That is to say, a positive set input pulse applied to the input terminal 16 results in a negative-going transition in the output signal *c* of FIGURE 3. It will also be understood that the circuit of FIGURE 1 can be modified by changing the polarity of the bias potential, by reversing the poling of the tunnel diode TD and rectifier TR and by employing negative polarity set and reset input pulses, if this is desired.

Figures 4, 5, 6:
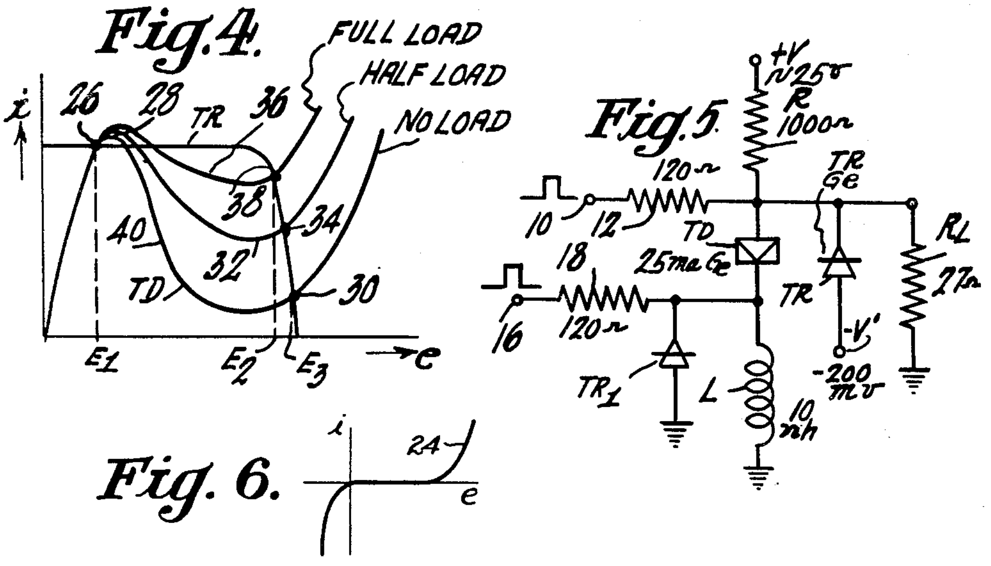
FIGURE 4 is a chart illustrating the current-voltage characteristics of the tunnel diode and tunnel rectifier in the circuit of FIGURE 1.
FIGURE 5 is a circuit diagram of a bistable circuit similar to the circuit of FIGURE 1 but including a different type of tunnel diode and including a different biasing arrangement.
FIGURES 6, 7 and 8 are diagrams of tunnel rectifier characteristics which will be referred to in explaining the construction of the circuit of FIGURE 1.
Figure 7:
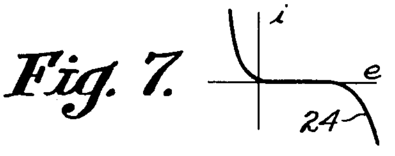
Figure 8:
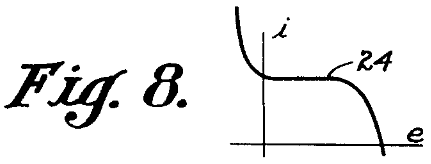

The manner in which the two stable operating conditions of the circuit of FIGURE 1 are provided is illustrated by the current-voltage characteristic curves of FIGURE 4 wherein the curve TD represents the characteristics of the tunnel diode TD in FIGURE 1 and the curve TR represents the characteristics of the tunnel rectifier TR. The tunnel rectifier TR in the circuit of FIGURE 1 is connected so that current normally flows from the +V terminal through tunnel rectifier TR to ground in a direction opposite the direction of the arrowhead in the tunnel rectifier symbol. If this direction of current through the tunnel rectifier TR is considered a positive direction, the tunnel rectifier characteristic 24 of FIGURE 2 is turned upside down to the position shown in FIGURE 6. Since the tunnel rectifier TR is connected and considered as a load on the tunnel diode TD, the TR characteristic is represented, as a load, by rotating the characteristic 24 about the voltage axis so that it occupies the position shown in FIGURE 7. The tunnel rectifier characteristic in FIGURE 7 is shifted upwardly to the position shown in FIGURE 8 because of the quiescent current normally flowing through the tunnel rectifier. FIGURE 4 shows the resulting relationship between the tunnel diode characteristic TD and the tunnel rectifier characteristic TR as a load on the tunnel diode.

The operating point 26 in FIGURE 4 is a stable operating condition for the circuit of FIGURE 1 and is a point defined by the intersection of the curves TD and TR. At operating point 26, the tunnel diode is at a point on the low voltage positive resistance region of its characteristic curve near the current peak 28, and the tunnel rectifier is at an operating point on its characteristic wherein it presents a very high impedance and is substantially nonconducting.

A second stable operating condition of the circuit is represented by the operating point 30 at the intersection of the high voltage positive resistance region of the tunnel diode characteristic TD and the low impedance, highly conducting region of the tunnel rectifier characteristic TR.

In FIGURE 4, the tunnel diode characteristic curve TD represents the characteristic of the tunnel diode TD in FIGURE 1 when there is no load coupled to the output terminal 22. The characteristic curve 32 in FIGURE 4 represents the effective characteristic of the tunnel diode TD as modified by the presence of a partial load on the tunnel diode due to a utilization circuit to the output terminal 22. The characteristic curve 36 in FIGURE 4 represents the tunnel diode characteristic as further modified by the effect of a full load coupled to the output terminal 22.

The low voltage operating point 26 of the tunnel diode TD provides a low output voltage $E_1$. The full load, high voltage operating point 38 of the tunnel diode provides an output voltage $E_2$; and the no-load, high voltage operating point 30 of the tunnel diode provides an output voltage $E_3$. It will be noted that the high voltage outputs $E_2$ and $E_3$ under full load and no-load conditions, respectively, are substantially equal. This desirable result is due to the nonlinear nature of the load presented to the tunnel diode TD by the tunnel rectifier TR. It is thus apparent that the output voltage provided when the circuit is in its high voltage operating condition is substantially constant, and is substantially unaffected by the amount of load current drawn by the utilization circuit.

The characteristics shown in FIGURE 4 illustrate another desirable feature of the circuit of the invention, namely, that the low voltage and high voltage operating points are points between which it is easy to switch the tunnel diode TD by the application of relatively small-amplitude set and reset input signals. In the low voltage operating condition, the operating point 26 is near the peak 28 of the characteristic curve TD, and a small input current is sufficient to move the operating point 26 over the peak 28 where the negative resistance region 40 of the tunnel diode characteristic is encountered, with the result that the operating point rapidly switches to a high voltage point on the tunnel diode characteristic. It is also easy to switch the operating condition from the high voltage condition back to the low voltage condition, regardless of the amount of load presented to the circuit by the utilization circuit. It will be noted that all of the high voltage operating points 30, 34 and 38 in FIGURE 4 are located near the current valleys of the corresponding characteristic curves so that a relatively small reduction in the current available to the tunnel diode TD causes the operating point to move down along the curve and to the left past the bottom of the valley and into the negative resistance region whereupon the operating point rapidly switches back to the low voltage operating point 26. The ease with which the circuit may be switched between its two operating conditions results from the nonlinear characteristic of the tunnel rectifier which acts as a load on the tunnel diode.

The value of the inductor L in the circuit of FIGURE 1 is selected to achieve a compromise between a desire to make it as small as possible so that it does not slow down the switching of the tunnel diode TD in one direction in response to a set pulse input on terminal 10, and a desire to make it large enough so that the reset input pulse applied to terminal 16 is developed across the inductor in sufficient magnitude to switch the tunnel diode in the opposite direction. A value for the inductor L of 10 nanohenries (10 milli-microhenries) has been found to be suitable. The input signal applied to the set terminal 10 may be a pulse of any duration and need not be a pulse having a fast-rising leading edge. Therefore, the set input point 14 is level sensitive and can be receptive to a plurality of input signals to provide an "and" function in which the plurality of input signals must be present to make the tunnel diode switch.

The input signal applied to the reset terminal 16 of FIGURE 1 must be a pulse having fast-rising leading edge and having a short duration. The pulse must be short enough so that the switching of the tunnel diode from its high voltage state to its low voltage state by the leading edge of the pulse is not followed by a switching of the tunnel diode back to the high voltage state by the trailing edge of the pulse. When the reset pulse is short, the trailing edge occurs when the operating point of the tunnel diode is at a low voltage, low current point on its characteristic curve and the trailing edge merely hastens movement of the operating point to the low voltage stable point 26. If it is desired to employ a reset pulse of appreciable duration compared with the switching time of the tunnel diode, the inductor L may be shunted by a tunnel rectifier in a manner that is described below in connection with FIGURE 5 of the drawings. The reset input point 20 of the circuit is not suitable for the reception of a plurality of inputs to perform the "and" function because a plurality of inputs cannot very conveniently be made to occur with simultaneous leading edges. However, a plurality of reset inputs can be employed to perform an "or" function wherein the circuit is switched in response to one or another of a plurality of inputs.

FIGURE 5 shows a resettable bistable circuit similar to that of FIGURE 1 except that the tunnel diode employed is a germanium tunnel diode, rather than a gallium arsenide tunnel diode, and the lower terminal of the germanium tunnel rectifier TR is returned to a —V' terminal, rather than to ground. The circuit of FIGURE 5 illustrates that various different tunnel diodes and tunnel rectifiers may be used in combination to achieve the objects of the invention provided that the direct current levels or direct current biases applied to the devices are such as to put their characteristic curves in the juxtaposition illustrated by the characteristic curves of FIGURE 4.

The circuit of FIGURE 5 also differs from the circuit of FIGURE 1 in that a second tunnel rectifier $TR_1$ is included and is connected across the inductor L. The tunnel rectifier $TR_1$ is poled to be non-conductive during the presence of the positive voltage developed across the inductor L by the leading edge of the positive input reset pulse, and to be freely conductive during the presence of the negative voltage developed across the inductor L by the trailing edge of the reset pulse. The tunnel rectifier $TR_1$ therefore prevents the tunnel diode TD from being switched by the trailing edge of the reset pulse applied to reset input terminal 16 regardles sof the duration of the reset pulse. It is not necessary (as is the case with the circuit of FIGURE 1) to employ a reset pulse having a short duration compared with the switching time of the tunnel diode TD.

The circuit of FIGURE 5 also includes indications of component or circuit element values which are given, solely by way of example, to indicate the order of magnitude of values which may be used.

What is claimed is:

1. A bistable circuit comprising a tunnel diode and an inductor connected in series, a tunnel rectifier connected across said series circuit to variably load said tunnel diode, means to direct current bias said tunnel diode and tunnel rectifier so that a first stable operating condition is provided with the tunnel rectifier in a high impedance state and the tunnel diode in a low voltage state, and so that a second stable operating condition is provided with the tunnel rectifier in a low impedance state and the tunnel diode in a high voltage state, means to apply set and reset pulses to said tunnel diode to switch the tunnel diode between high and low voltage states, and means to derive an output signal from said tunnel diode.

2. A bistable circuit comprising a tunnel diode and an inductor connected in series, a nonlinear impedance element coupled across said tunnel diode and inductor, whereby said element constitutes a nonlinear load on said diode, means to direct current bias said diode and element so that a first stable operating condition is provided with said element in a high impedance state and said diode in a low voltage state, and so that a second stable operating condition is provided with said element in a low impedance state and the said diode in a high voltage state, means to apply an input pulse across said diode and inductor to switch the circuit from the first operating condition to the second operating condition, means to apply an input pulse across said inductor to switch the circuit from the second operating condition to the first operating condition, and means to derive an output from across said diode and inductor.

3. A bistable circuit comprising a tunnel diode and an inductor connected in series, a nonlinear impedance element coupled across said tunnel diode and inductor, whereby said element constitutes a nonlinear load on said diode, means to direct current bias said diode and element so that a first stable operating condition is provided with said element in a high impedance state and said diode in a low voltage state, and so that a second stable operating condition is provided with said element in a low impedance state and the said diode in a high voltage state, means to apply an input pulse across said diode and inductor to switch the circuit from the first operating condition to the second operating condition, means to apply an input pulse across said inductor to switch the circuit from the second operating condition to the first operating condition, said inductor having a value selected to be small enough to permit rapid switching of the diode in response to the input set pulse and large enough to permit switching of the diode in response to the leading edge of the input reset pulse, and means to derive an output from across said diode and inductor.

4. A resettable bistable circuit comprising a series circuit including a tunnel diode and an inductor, a tunnel rectifier coupled across said tunnel diode and inductor, whereby said tunnel rectifier constitutes a nonlinear load on said tunnel diode, means to direct current bias said tunnel diode and tunnel rectifier so that a first stable operating condition is provided with the tunnel rectifier in its high impedance state and the tunnel diode in a low voltage state, and so that a second stable operating condition is provided with the tunnel rectifier in a low impedance state and the tunnel diode in a high voltage state, means to apply a set pulse across said tunnel diode and inductor to switch the circuit from the first operating condition to the second operating condition, means to apply a reset pulse across said inductor to switch the circuit from the second operating condition to the first operating condition, and means to derive an output from across said tunnel diode and inductor.

5. A resettable bistable circuit comprising a series circuit including a tunnel diode and an inductor, a tunnel rectifier coupled across said tunnel diode and inductor, whereby said tunnel rectifier constitutes a nonlinear load on said tunnel diode, means to direct current bias said tunnel diode and tunnel rectifier so that a first stable operating condition is provided with the tunnel rectifier in its high impedance state and the tunnel diode in a low voltage state, and so that a second stable operating condition is provided with the tunnel rectifier in a low impedance state and the tunnel diode in a high voltage state, means to apply a set pulse across said tunnel diode and inductor to switch the circuit from the first operating condition to the second operating condition, means to apply a reset pulse across said inductor to switch the circuit from the second operating condition to the first operating condition, said inductor having a value selected to be small enough to permit rapid switching of the diode in response to the input set pulse and large enough to permit switching of the diode in response to the leading edge of the input reset pulse, and means to derive an output from across said tunnel diode and inductor.

6. A resettable bistable circuit comprising a series circuit including a tunnel diode and an inductor, a first tunnel rectifier coupled across said tunnel diode and inductor, whereby said tunnel rectifier constitutes a nonlinear load on said tunnel diode, means to direct current bias said tunnel diode and tunnel rectifier so that a first stable operating condition is provided with the tunnel rectifier in its high impedance state and the tunnel diode in a low voltage state, and so that a second stable operating condition is provided with the tunnel rectifier in a low impedance state and the tunnel diode in a high voltage state, means to apply a set pulse across said tunnel diode and inductor to switch the circuit from the first operating condition to the second operating condition, means to apply a reset pulse across said inductor to switch the circuit from the second operating condition to the first operating condition, said inductor having a value selected to be small enough to permit rapid switching of the diode in response to the input set pulse and large enough to permit switching of the diode in response to the leading edge of the input reset pulse, a second tunnel rectifier connected across said inductor and poled to conduct during the trailing edge of said reset pulse, and means to derive an output from across said tunnel diode and inductor.

7. A resettable bistable logic circuit comprising a series circuit including a resistor, a tunnel diode and an inductor connected in series in the order named, a tunnel rectifier coupled across said tunnel diode and inductor, whereby said tunnel rectifier constitutes a nonlinear load on said tunnel diode, means to direct current bias said tunnel diode and tunnel rectifier so that a first stable operating condition is provided with the tunnel rectifier in its high impedance state and the tunnel diode in a low voltage state near the current peak of its characteristic curve from which it can easily be switched, and so that a second stable operating condition is provided with the tunnel rectifier in a low impedance state and the tunnel diode in a high voltage state in the current valley of its characteristic curve from which it can easily be switched, means to apply a set pulse across said tunnel diode and inductor to switch the circuit from the first operating condition to the second operating condition, means to apply a reset pulse across said inductor to switch the circuit from the second operating condition to the first operating condition, said inductor having a value selected to be small enough to permit rapid switching of the diode in response to the leading edge of the input reset pulse, and means to derive an output from across said tunnel diode and inductor for application to a utilization circuit, whereby the output voltage when the circuit is in the second operating condition is substantially constant and is substantially unaffected by the amount of load provided by the utilization circuit.

8. A resettable bistable logic circuit comprising a series circuit including a resistor, a tunnel diode and an inductor connected in series in the order named, a first tunnel rectifier coupled across said tunnel diode and inductor, whereby said tunnel rectifier constitutes a nonlinear load on said tunnel diode, means to direct current bias said tunnel diode and tunnel rectifier so that a first stable operating condition is provided with the tunnel rectifier in its high impedance state and the tunnel diode in a low voltage state near the current peak of its characteristic curve from which it can easily be switched, and so that a second stable operating condition is provided with the tunnel rectifier in a low impedance state and the tunnel diode in a high voltage state in the current valley of its characteristic curve from which it can easily be switched, means to apply a set pulse across said tunnel diode and inductor to switch the circuti from the first operating condition to the second operating condition, means to apply a reset pulse across said inductor to switch the circuit from the second operating condition to the first operating condition, said inductor having a value selected to be small enough to permit rapid switching of the diode in response to the leading edge of the input reset pulse, a second tunnel rectifier connected across said inductor and poled to conduct during the trailing edge of said reset pulse, and means to derive an output from across said tunnel diode and inductor for application to a utilization circuit, whereby the output voltage when the circuit is in the second operating condition is substantially constant and is substantially unaffected by the amount of load provided by the utilization circuit.

References Cited in the file of this patent

Article: Esaki (Tunnel) Diode Logic Circuits, by Neff et al., 1960 International Solid-State Circuits Conference, Feb. 10, 1960, pages 16, 17.

Article: The Tunnel Diode as a Storage Element, by Miller et al., 1960 International Solid-State Circuits Conference, Feb. 11, 1960, pages 52, 53.